(12) United States Patent
Shibata et al.

(10) Patent No.: US 7,981,809 B2
(45) Date of Patent: Jul. 19, 2011

(54) FILM FORMATION METHOD AND APPARATUS FOR SEMICONDUCTOR PROCESS

(75) Inventors: Tetsuya Shibata, Nirasaki (JP); Yutaka Takahashi, Kai (JP); Kota Umezawa, Nirasaki (JP); Masahiko Tomita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1085 days.

(21) Appl. No.: 11/298,607

(22) Filed: Dec. 12, 2005

(65) Prior Publication Data

US 2006/0128161 A1    Jun. 15, 2006

(30) Foreign Application Priority Data

Dec. 14, 2004   (JP) ................................. 2004-361108

(51) Int. Cl.
*H01L 21/31* (2006.01)
(52) U.S. Cl. ...................................................... 438/775
(58) Field of Classification Search .......................... None
See application file for complete search history.

(56) References Cited

U.S. PATENT DOCUMENTS

| | | | | |
|---|---|---|---|---|
| 5,976,900 A * | 11/1999 | Qiao et al. | ....................... | 438/14 |
| 6,022,586 A * | 2/2000 | Hashimoto et al. | ............. | 427/237 |
| 6,121,161 A * | 9/2000 | Rossman et al. | ............... | 438/783 |
| 6,211,065 B1 * | 4/2001 | Xi et al. | ......................... | 438/627 |
| 6,251,188 B1 * | 6/2001 | Hashimoto et al. | ............ | 118/715 |
| 6,323,119 B1 * | 11/2001 | Xi et al. | ......................... | 438/627 |
| 6,413,321 B1 * | 7/2002 | Kim et al. | ...................... | 118/725 |
| 6,443,165 B1 * | 9/2002 | Akahori et al. | ................ | 134/1.1 |
| 6,451,686 B1 * | 9/2002 | Ngai et al. | ..................... | 438/623 |
| 6,506,662 B2 * | 1/2003 | Ogura et al. | .................... | 438/423 |
| 6,530,992 B1 * | 3/2003 | Yang et al. | ..................... | 118/695 |
| 6,624,064 B1 * | 9/2003 | Sahin et al. | .................... | 438/627 |
| 6,660,517 B1 * | 12/2003 | Wilding et al. | ............. | 435/289.1 |
| 6,734,101 B1 * | 5/2004 | Bao et al. | ....................... | 438/687 |
| 6,846,745 B1 * | 1/2005 | Papasouliotis et al. | ........ | 438/706 |
| 7,288,284 B2 * | 10/2007 | Li et al. | .......................... | 427/237 |
| 7,344,927 B2 * | 3/2008 | Tsujimura et al. | ............. | 438/151 |
| 7,371,427 B2 * | 5/2008 | Rajagopalan et al. | ......... | 427/237 |
| 7,455,893 B2 * | 11/2008 | Rossman | ....................... | 427/579 |
| 2002/0016026 A1 * | 2/2002 | Tsujimura et al. | ............. | 438/149 |
| 2002/0155679 A1 * | 10/2002 | Ogura et al. | .................... | 438/423 |
| 2004/0231795 A1 * | 11/2004 | Rajagopalan et al. | ... | 156/345.24 |

(Continued)

FOREIGN PATENT DOCUMENTS

JP          60-246281       12/1985

(Continued)

OTHER PUBLICATIONS

TW 518643 A; Cheng. English Abstract and figure. Jan. 21, 2003.*
JP 05-251428; 1993, English Translation and Figures. 18 pgs.*

*Primary Examiner* — David E Graybill
(74) *Attorney, Agent, or Firm* — Oblon, Spivak, McClelland, Maier & Neustadt, L.L.P.

(57) ABSTRACT

A film formation method for a semiconductor process for forming a silicon oxynitride film on a target substrate within a reaction chamber includes a step of performing a pre-process on members inside the reaction chamber without the target substrate loaded therein, and a step of then forming a silicon oxynitride film on the target substrate within the reaction chamber. The pre-process is arranged to supply a pre-process gas containing a nitriding gas or oxynitriding gas into the reaction chamber, and setting an interior of the reaction chamber at a first temperature and a first pressure.

7 Claims, 6 Drawing Sheets

U.S. PATENT DOCUMENTS

| | | | |
|---|---|---|---|
| 2004/0235292 A1* | 11/2004 | Rajagopalan et al. | 438/637 |
| 2005/0082002 A1* | 4/2005 | Sato et al. | 156/345.29 |
| 2005/0085098 A1* | 4/2005 | Timmermans et al. | 438/794 |
| 2005/0118737 A1* | 6/2005 | Takagi et al. | 438/14 |
| 2005/0133162 A1* | 6/2005 | Tetsuka et al. | 156/345.43 |
| 2005/0214455 A1* | 9/2005 | Li et al. | 427/248.1 |
| 2006/0108331 A1* | 5/2006 | Nozawa et al. | 219/121.41 |
| 2006/0128161 A1* | 6/2006 | Shibata et al. | 438/769 |

FOREIGN PATENT DOCUMENTS

| | | |
|---|---|---|
| JP | 61025636 A * | 2/1986 |
| JP | 5-251428 | 9/1993 |
| JP | 2000-183055 | 6/2000 |
| JP | 2003-243388 | 8/2003 |
| JP | 2004-303894 | 10/2004 |
| JP | 2004-311929 | 11/2004 |
| KR | 2000-0039247 | 7/2000 |

* cited by examiner

| | Pre-nitridation time | Dummy wafer replacement | Dummy wafer state |
|---|---|---|---|
| PE 1 | 2 hours | Yes | Not saturated |
| PE 2 | 4 hours | Yes | Almost saturated |
| PE 3 | 6 hours | Yes | Saturated |
| PE 4 | 8 hours | Yes | Saturated |
| PE 5 | 6 hours | No | Saturated |
| CE 1 | Zero | No | ------ |
| CE 2 | Zero | No | ------ |

| | Pre-nitridation time | Reaction tube replacement | Reaction tube state |
|---|---|---|---|
| PE 6 | 2 hours | Yes | Almost saturated |
| PE 7 | 4 hours | Yes | Saturated |
| PE 8 | 6 hours | Yes | Saturated |
| CE 3 | Zero | Yes | ------ |

FILM FORMATION METHOD AND APPARATUS FOR SEMICONDUCTOR PROCESS

CROSS-REFERENCE TO RELATED APPLICATIONS

This application is based upon and claims the benefit of priority from prior Japanese Patent Application No. 2004-361108, filed Dec. 14, 2004, the entire contents of which are incorporated herein by reference.

BACKGROUND OF THE INVENTION

1. Field of the Invention

The present invention relates to a film formation method and apparatus for a semiconductor process for forming a silicon oxynitride film (SiON film) on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices, a process, such as a heat process or CVD (Chemical Vapor Deposition), is performed to form a thin film, such as a silicon nitride film or silicon oxynitride film, on a target substrate, such as a semiconductor wafer. For example, Jpn. Pat. Appln. KOKAI Publication No. 5-251428 (Patent Document 1) discloses a method for forming a silicon oxynitride film by a heat process. This method comprises a step of forming a silicon oxide film on a target substrate within a reaction chamber, and a step of nitriding the silicon oxide film on the target substrate within the reaction chamber.

In recent years, semiconductor devices have been increasingly miniaturized, and thus silicon oxynitride film are required to be thinner. As silicon oxynitride films are thinner in semiconductor devices, small fluctuations of the nitrogen concentration in the silicon oxynitride films have a larger effect on electrical characteristics of the devices. For example, in the case of a vertical heat processing apparatus of the batch type, the nitrogen concentration in formed silicon oxynitride films is reduced only by replacement of members inside a reaction chamber. Since the nitrogen concentration in the silicon oxynitride films thus changes, the electrical characteristics of devices that contain such films also fluctuate.

BRIEF SUMMARY OF THE INVENTION

An object of the present invention is to provide a film formation method and apparatus for a semiconductor process, which can reduce change in the nitrogen concentration in a silicon oxynitride film, thereby continuously and stably fabricating silicon oxynitride films having a predetermined nitrogen concentration.

Another object of the present invention is to provide a film formation method and apparatus for a semiconductor process, which can increase the nitrogen concentration in silicon oxynitride films.

According to a first aspect of the present invention, there is provided a film formation method for a semiconductor process for forming a silicon oxynitride film on a target substrate within a reaction chamber, the method comprising:

performing a pre-process on members inside the reaction chamber without the target substrate loaded therein, while supplying a pre-process gas containing a nitriding gas or oxynitriding gas into the reaction chamber, and setting an interior of the reaction chamber at a first temperature and a first pressure; and then, loading the target substrate into the reaction chamber, and performing a film formation process to form a silicon oxynitride film on the target substrate.

According to a second aspect of the present invention, there is provided a film formation apparatus for a semiconductor process, comprising:

a reaction chamber configured to accommodate a target substrate;

a support member configured to support the target substrate within the reaction chamber;

a heater configured to heat the target substrate within the reaction chamber;

an exhaust system configured to exhaust an interior of the reaction chamber;

a pre-process gas supply circuit configured to supply a pre-process gas containing a nitriding gas or oxynitriding gas into the reaction chamber;

a film formation gas supply circuit configured to supply a film formation gas for forming a silicon oxynitride film into the reaction chamber; and a control section configured to control an operation of the apparatus, wherein the control section executes performing a pre-process on members inside the reaction chamber without the target substrate loaded therein, while supplying the pre-process gas into the reaction chamber, and setting an interior of the reaction chamber at a first temperature and a first pressure, and then, loading the target substrate into the reaction chamber, and performing a film formation process to form a silicon oxynitride film on the target substrate.

According to a third aspect of the present invention, there is provided a computer readable medium used for a film formation apparatus for a semiconductor process for forming a silicon oxynitride film on a target substrate within a reaction chamber, the medium containing program instructions for execution on a processor, which, when executed by the processor, cause the apparatus to execute performing a pre-process on members inside the reaction chamber without the target substrate loaded therein, while supplying a pre-process gas containing a nitriding gas or oxynitriding gas into the reaction chamber, and setting an interior of the reaction chamber at a first temperature and a first pressure; and then, loading the target substrate into the reaction chamber, and performing a film formation process to form a silicon oxynitride film on the target substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
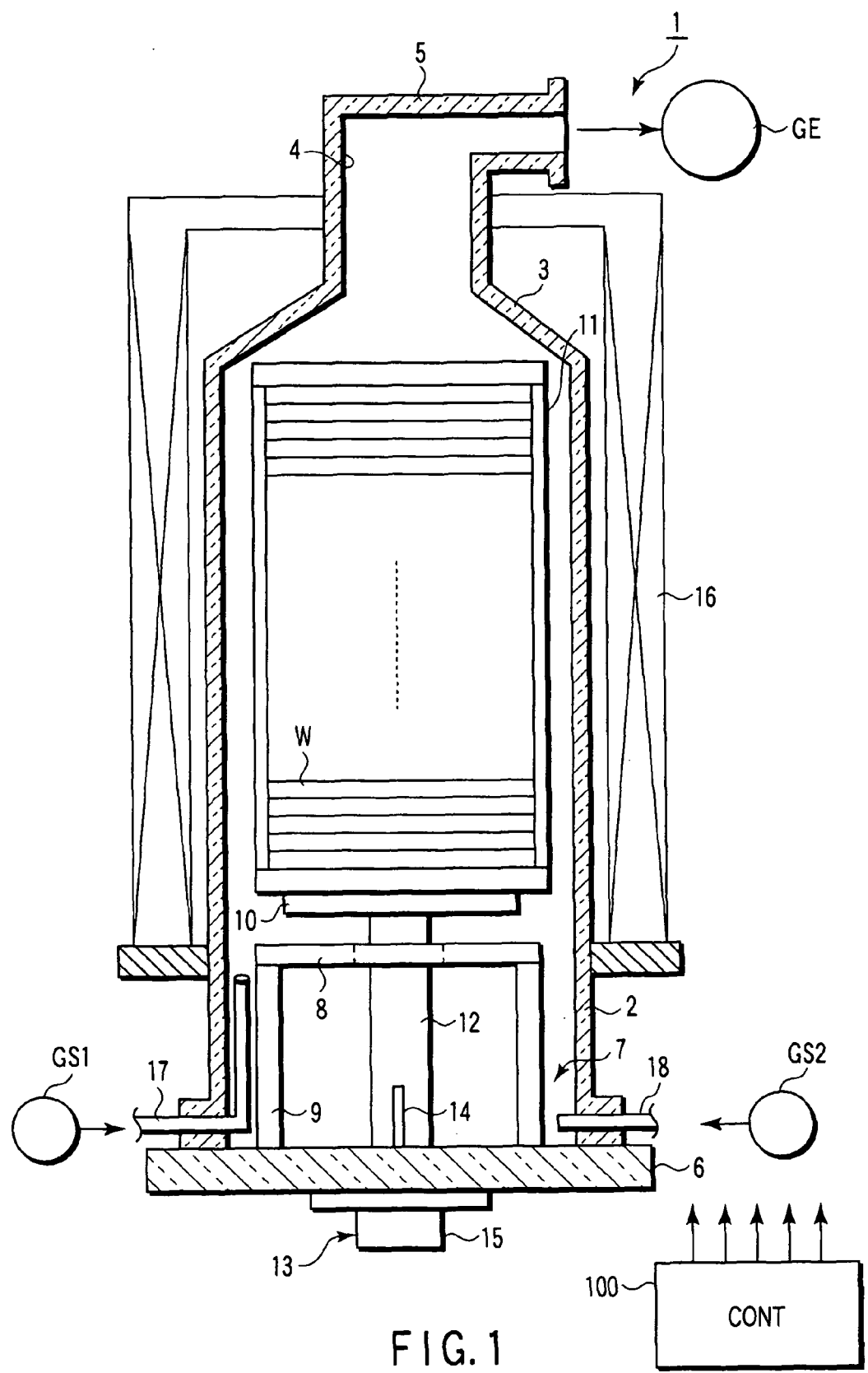
FIG. 1 is a view showing a vertical heat processing apparatus according to a first embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

FIG. 1 is a view showing a vertical heat processing apparatus according to a first embodiment of the present invention. This apparatus is configured as a vertical heat processing apparatus of the batch type to form a silicon oxynitride film. As shown in FIG. 1, the heat processing apparatus 1 includes an essentially cylindrical reaction tube (reaction chamber) 2 whose longitudinal direction is set in the vertical direction. The reaction tube 2 comprises, as the main component (more than 50%), a material selected from the group consisting of heat-resistant and corrosion-resistant materials, such as quartz and silicon carbide (SiC).

The top of the reaction tube 2 is formed as an essentially conical ceiling 3 whose diameter decreases toward the top. The ceiling 3 has an exhaust port 4 formed at the center, for exhausting gas inside the reaction tube 2. The exhaust port 4 is connected to an exhaust section GE through an airtight exhaust line 5. The exhaust section GE has a pressure adjusting mechanism including, e.g. a valve and a vacuum exhaust pump (not shown in FIG. 1, but shown in FIG. 2 with a reference symbol 127). The exhaust section GE is used to exhaust the atmosphere within the reaction tube 2, and set it at a predetermined pressure (vacuum level).

A lid 6 is disposed below the reaction tube 2. The lid 6 is made of a heat-resistant and corrosion-resistant material, such as quartz. The lid 6 is moved up and down by a boat elevator described later (not shown in FIG. 1, but shown in FIG. 2 with a reference symbol 128). When the lid 6 is moved up by the boat elevator, the bottom of the reaction tube 2 (load port) is closed. When the lid 6 is moved down by the boat elevator, the bottom of the reaction tube 2 (load port) is opened.

A thermal insulation cylinder 7 is disposed on the lid 6. The thermal insulation cylinder 7 is provided with a planar heater 8 made of a resistive heating body to prevent the temperature inside the reaction tube from decreasing due to heat radiation from the load port of the reaction tube 2. The heater 8 is supported at a predetermined height level relative to the top face of the lid 6 by a cylindrical support 9.

A rotary table 10 is disposed above the thermal insulation cylinder 7. The rotary table 10 is used as a table for rotatably mounting thereon a wafer boat 11 that holds target substrates, such as semiconductor wafers W. Specifically, the rotary table 10 is connected to a rotary shaft 12 disposed therebelow. The rotary shaft 12 passes through the center of the heater 8 and is connected to a rotation mechanism 13 for rotating the rotary table 10.

The rotation mechanism 13 is mainly formed of a motor (not shown), and a rotation feeder 15 with an axle 14 that airtightly penetrates the lid 6 from below. The axle 14 is coupled to the rotary shaft 12 of the rotary table 10, to transmit the rotational force of the motor to the rotary table 10 through the rotary shaft 12. When the axle 14 is rotated by the motor of the rotation mechanism 13, the rotational force of the axle 14 is transmitted to the rotary shaft 12, and the rotary table 10 is rotated.

The wafer boat 11 is configured to hold a plurality of, e.g. 100, wafers W, which are a set of semiconductor wafers or a set of semiconductor wafers and dummy wafers, at predetermined intervals in the vertical direction. The dummy wafers are disposed at predetermined positions in the wafer boat 11, such as positions above and below semiconductor wafers. The number of dummy wafers may be changed e.g. in accordance with the number of semiconductor wafers W mounted on the wafer boat. The wafer boat 11 comprises, as the main component, a material selected from the group consisting of heat-resistant and corrosion-resistant materials, such as quartz and silicon carbide (SiC). Since the wafer boat 11 is mounted on the rotary table 10, the wafer boat 11 is rotated along with the rotary table 10, and thus the semiconductor wafers W held in the wafer boat 11 are rotated.

A heater 16 made of, e.g. a resistive heating body is disposed near the reaction tube 2 to surround the tube 2. The interior of the reaction tube 2 is heated by the heater 16, so that the semiconductor wafers W are heated up (increase in temperature) to a predetermined temperature.

Process gas feed lines 17 penetrate the sidewall of the reaction tube 2 near the bottom, and are used for supplying process gases (such as a pre-process gas and a film formation gas) into the reaction tube 2. Each process gas feed line 17 is connected to a process gas supply source GS1 through a mass-flow controller (MFC) described later (not shown in FIG. 1, but shown in FIG. 2 with a reference symbol 125).

The pre-process gas contains a nitriding gas or oxynitriding gas, such as at least one gas selected from the group consisting of ammonia ($NH_3$), nitrogen oxide (NO), dinitrogen oxide ($N_2O$), and nitrogen dioxide ($NO_2$). For example, the film formation gas comprises an oxidizing gas for oxidizing a silicon surface of a target substrate (such as a silicon wafer surface) to form a silicon oxide film, and a nitriding gas or oxynitriding gas for nitriding the silicon oxide film to form a silicon oxynitride film (SiON film). For example, the oxidizing gas contains at least one gas selected from the group consisting of water ($H_2O$) and oxygen ($O_2$) For example, the nitriding gas or oxynitriding gas contains at least one gas selected from the group consisting of ammonia, nitrogen oxide, dinitrogen oxide, and nitrogen dioxide.

Although FIG. 1 shows only one process gas feed line 17, a plurality of process gas feed lines 17 are disposed in accordance with the type of process steps or the type of gases to be supplied into the reaction tube 2, in this embodiment. Specifically, a gas feed line for supplying an oxidizing gas into the reaction tube 2 and a gas feed line for supplying a nitriding gas or oxynitriding gas into the reaction tube 2 (used for both of the pre-process and film formation process) penetrate the sidewall of the reaction tube 2 near the bottom.

A purge gas feed line 18 also penetrates the sidewall of the reaction tube 2 near the bottom. The purge gas feed line 18 is connected to a purge gas supply source GS2 through an MFC described later (not shown in FIG. 1, but shown in FIG. 2 with a reference symbol 125).

Figure 2:
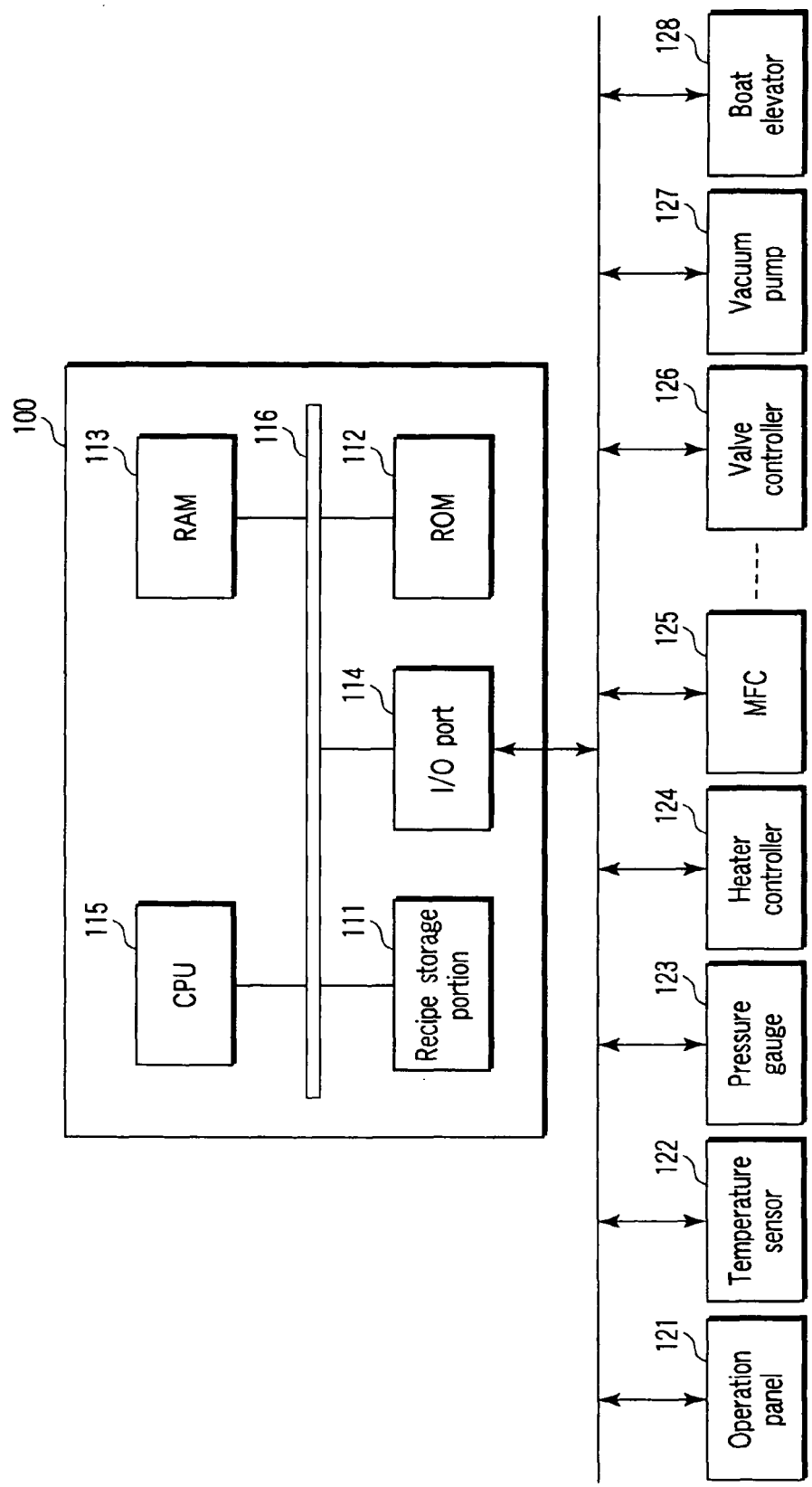
FIG. 2 is a view showing the structure of the control section of the apparatus shown in FIG. 1.

The heat processing apparatus 1 further includes a control section 100 for controlling respective portions of the apparatus. FIG. 2 is a view showing the structure of the control section 100. As shown in FIG. 2, the control section 100 is connected to an operation panel 121, (a group of) temperature sensors 122, (a group of) pressure gages 123, a heater controller 124, MFCs 125, valve controllers 126, a vacuum pump 127, a boat elevator 128, and so forth.

The operation panel 121 includes a display screen and operation buttons, and is configured to transmit operator's instructions to the control section 100, and show various data transmitted from the control section 100 on the display screen. Temperature sensors 122 are configured to measure the temperature at respective portions inside the reaction tube 2 and exhaust line 5, and transmit measurement values to the control section 100. The pressure gages 123 are configured to measure the pressure at respective portions inside the reaction tube 2 and exhaust line 5, and transmit measurement values to the control section 100.

The heater controller 124 is configured to respectively control the heater 8 and heater 16. The heater controller 124 turns on the heater 8 and heater 16 to generate heat, in accordance with instructions from the control section 100. The heater controller 124 is also configured to measure the power consumption of the heater 8 and heater 16, and transmit it to the control section 100.

The MFCs 125 are respectively disposed on piping lines, such as the process gas feed lines 17 and purge gas feed line 18. Each MFC 125 is configured to control the flow rate of a gas flowing through the corresponding line in accordance with instructed values received from the control section 100. Further, each MFC 125 is configured to measure the flow rate of a gas actually flowing, and transmit the reading to the control section 100.

The valve controllers 126 are respectively disposed on piping lines and configured to control the opening rate of valves disposed on piping lines, in accordance with instructed values received from the control section 100. The vacuum pump 127 is connected to the exhaust line 5 and configured to exhaust gas inside the reaction tube 2.

The boat elevator 128 is configured to move up the lid 6, so as to load the wafer boat 11 (semiconductor wafers W) placed on the rotary table 10 into the reaction tube 2. The boat elevator 128 is also configured to move the lid 6 down, so as to unload the wafer boat 11 (semiconductor wafers W) placed on the rotary table 10 from the reaction tube 2.

The control section 100 includes a recipe storage portion 111, a ROM 112, a RAM 113, an I/O port 114, and a CPU 115. These members are inter-connected via a bus 116 so that data can be transmitted between them through the bus 116.

Figure 3:
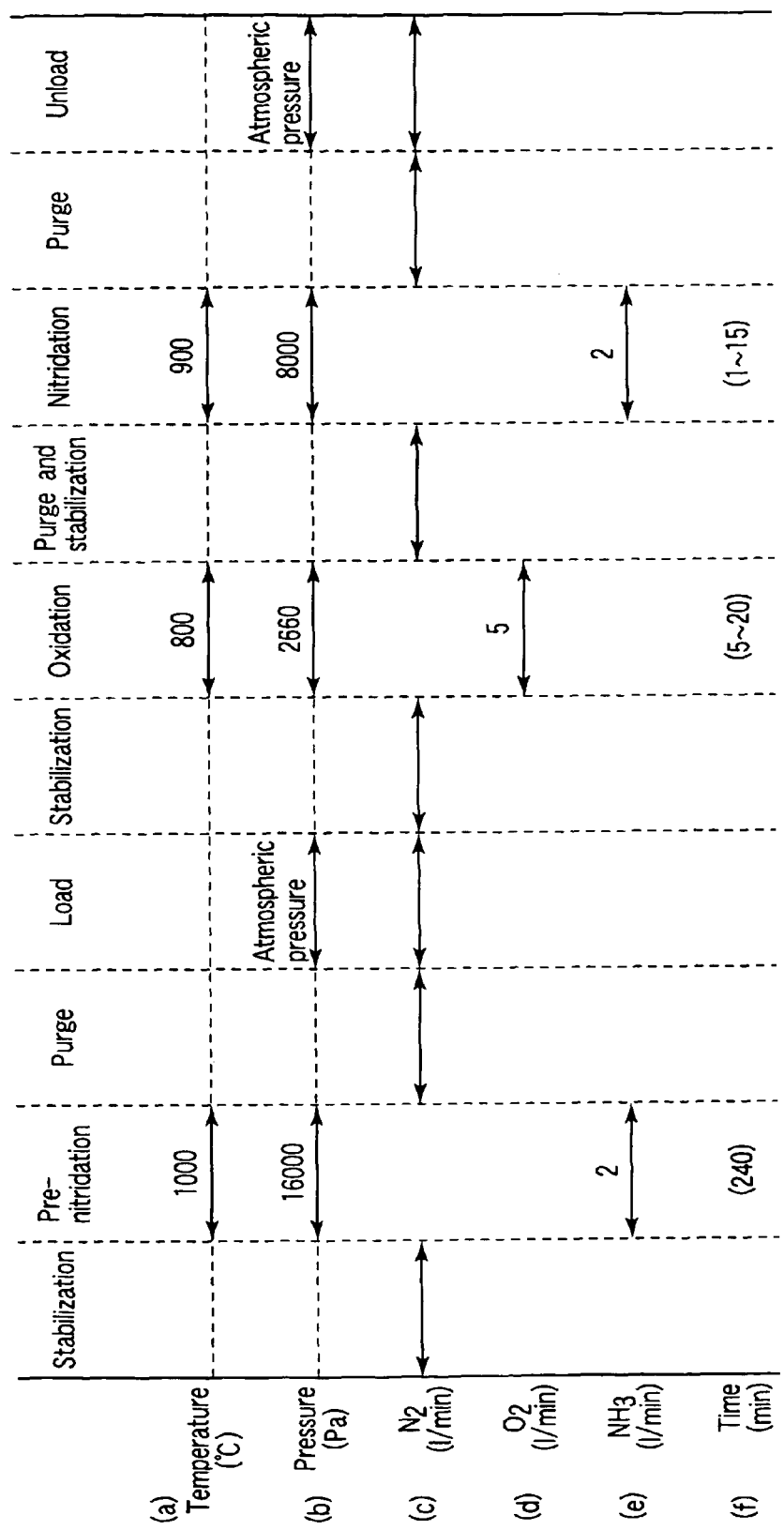
FIG. 3 is a view showing the recipe of a film formation method according to an embodiment of the present invention.

The recipe storage portion 111 stores a setup recipe and a plurality of process recipes. After the heat processing apparatus 1 is manufactured, only the setup recipe is initially stored. The setup recipe is executed when a thermal model or the like for a specific heat processing apparatus is formed. The process recipes are prepared respectively for heat processes to be actually performed by a user. Each process recipe prescribes temperature changes at respective portions, pressure changes inside the reaction tube 2, start/stop timing for supply of process gases, and supply rates of process gases, from the time semiconductor wafers W are loaded into the reaction tube 2 to the time processed wafers W are unloaded, as shown in FIG. 3 described later, for example.

The ROM 112 is a recording medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controller 124, MFCs 125, valve controllers 126, vacuum pump 127, and boat elevator 128, and is configured to control output/input of data or signals.

The CPU (Central Processing Unit) 115 is the hub of the control section 100. The CPU 115 is configured to run control programs stored in the ROM 112, and control an operation of the heat processing apparatus 1, in accordance with a recipe (process recipe) stored in the recipe storage portion 111, following instructions from the operation panel 121. Specifically, the CPU 115 causes the temperature sensors 122, pressure gages 123, and MFCs 125 to measure temperatures, pressures, and flow rates at respective portions inside the reaction tube 2 and exhaust line 5. Further, the CPU 115 outputs control signals, based on measurement data, to the heater controller 124, MFCs 125, valve controllers 126, and vacuum pump 127, to control the respective portions mentioned above in accordance with a process recipe.

Next, an explanation will be given of a method of forming a silicon oxynitride film, using the heat-processing apparatus 1 described above. Specifically, according to this embodiment, at first, a pre-process is performed on members inside the reaction tube 2 without semiconductor wafers W loaded therein. Then, semiconductor wafers W are loaded into the reaction tube 2, and oxygen ($O_2$) is supplied to form a silicon oxide film (thermal oxide film) on the semiconductor wafers W. Then, ammonia ($NH_3$) is supplied to nitride the silicon oxide film so as to form a silicon oxynitride film. FIG. 3 is a view showing the recipe of a film formation method according to an embodiment of the present invention.

The respective components of the heat-processing apparatus 1 described below are operated under the control of the control section 100 (CPU 115). The temperature and pressure inside the reaction tube 2 and the gas flow rates during the processes are set in accordance with the recipe shown in FIG. 3, while the control section 100 (CPU 115) controls the heater controller 124 (for the heaters 8 and 16), MFCs 125 (on the process gas feed line 17 and purge gas feed line 18), valve controllers 126, and vacuum pump 127, as described above.

At first, in order to perform the pre-process, the interior of the reaction tube 2 is heated by the heater 16 at a predetermined load temperature, such as 300° C. Further, nitrogen ($N_2$) is supplied through the purge gas feed line 18 into the reaction tube 2 at a predetermined flow rate. Then, a wafer boat 11 that does not hold semiconductor wafers W is placed on the lid 6 (on the rotary table 10), and the lid 6 is moved up by the boat elevator 128. As a consequence, the wafer boat 11 is loaded into the reaction tube 2 and the reaction tube 2 is airtightly closed (load step). At this time, where dummy wafers are utilized in the subsequent film formation process for forming a silicon oxynitride film, the dummy wafers are placed at predetermined positions in the wafer boat 11 in this pre-process.

Then, nitrogen is supplied through the purge gas feed line 18 into the reaction tube 2 at a predetermined flow rate, and the interior of the reaction tube 2 is heated by the heater 16 to a predetermined nitridation temperature (process temperature), such as 1,000° C., as shown in FIG. 3, (a). Further, gas inside the reaction tube 2 is exhausted to set the interior of the reaction tube 2 at a predetermined pressure, such as 16,000 Pa (120 Torr), as shown in FIG. 3, (b). The pressure reduction and heating operations are performed until the reaction tube 2 is stabilized at the predetermined pressure and temperature (stabilization step).

When the interior of the reaction tube 2 is stabilized at the predetermined pressure and temperature, the supply of nitrogen through the purge gas feed line 18 is stopped. Then, a nitriding gas (pre-process gas) is supplied through the process gas feed line 17 into the reaction tube 2 to nitride the surface of members inside the reaction chamber (pre-nitridation step). In this embodiment, the nitriding gas is ammonia ($NH_3$) supplied at a predetermined flow rate, such as 2 liters/min, as shown in FIG. 3, (e). The pre-nitridation step is performed until the surface nitridation of members inside the reaction tube 2, such as the inner wall of the tube 2, the dummy wafers, and the wafer boat 11, is essentially saturated. For example, the pre-nitridation step is performed for 240 minutes, as shown in FIG. 3, (f).

During the pre-nitridation step, the temperature inside the reaction tube 2 is preferably set to be within a range of 600 to 1,050° C., and more preferably within a range of 800 to 1,000° C. If the temperature inside the reaction tube 2 is lower than 600° C., nitridation of the inner wall of the reaction tube 2 and so forth takes a too long time. If the temperature inside the reaction tube 2 is higher than 600° C. and particularly higher than 800° C., the nitridation can be performed in a short time. However, if the temperature is too high, it is necessary to take countermeasures to prevent components of the heat processing apparatus 1 from suffering thermal degradation. For this reason, during the pre-nitridation step, the temperature inside the reaction tube 2 is preferably set to be not more than 1,050° C., and more preferably not more than 1,000° C.

During the pre-nitridation step, the pressure inside the reaction tube 2 is preferably set to be within a range of 665 Pa (5 Torr) to 100,000 Pa (750 Torr). Particularly, the pressure inside the reaction tube 2 during the pre-nitridation step is more preferably set to be within a range of 2,660 Pa (20 Torr) to 17,290 Pa (130 Torr), and most preferably within a range of 13,300 Pa (100 Torr) to 16,000 Pa (120 Torr). Using a pressure within this range, it is possible to efficiently perform the nitridation process.

When the inner wall of the reaction tube 2 and so forth are sufficiently nitrided, the supply of ammonia through the process gas feed line 17 is stopped. Then, the interior of the reaction tube 2 is exhausted, and nitrogen is supplied through the purge gas feed line 18 at a predetermined flow rate, so that the gas inside the reaction tube 2 is exhausted to the exhaust line 5 (purge step). It is preferable to perform cycle purge, i.e., to repeat the gas exhaust and nitrogen gas supply for the interior of the process tube 2 a plurality of times, in order to reliably exhaust the gas inside the process tube 2.

Then, the temperature inside the reaction tube 2 is lowered to a predetermined temperature, such as 300° C. Further, nitrogen is supplied through the purge gas feed line 18 into the reaction tube 2 at a predetermined flow rate, so that the pressure inside the process tube 2 is returned to atmospheric pressure, as shown in FIG. 3, (b). Then, the lid 6 is moved down by the boat elevator 128, and the wafer boat 11 is thereby unloaded out of the reaction tube 2 (unload step).

Thereafter, in order to perform the film formation process, semiconductor wafers having a silicon surface (typically, silicon wafers) W are transferred onto the wafer boat 11. At this time, where dummy wafers are utilized in the film formation process, the dummy wafers subjected to the pre-process are kept on the wafer boat 11. Then, a wafer boat 11 that holds the semiconductor wafers W is placed on the lid 6, and the lid 6 is moved up by the boat elevator 128. As a consequence, the wafer boat 11 with the semiconductor wafers W supported thereon is loaded into the reaction tube 2 and the reaction tube 2 is airtightly closed (load step).

Then, nitrogen is supplied through the purge gas feed line 18 into the reaction tube 2 at a predetermined flow rate, and the interior of the reaction tube 2 is heated by the heater 16 to a predetermined oxidation temperature, such as 800° C., as shown in FIG. 3, (a). Further, gas inside the reaction tube 2 is exhausted to set the interior of the reaction tube 2 at a predetermined pressure, such as 2,660 Pa (20 Torr), as shown in FIG. 3, (b). The pressure reduction and heating operations are performed until the reaction tube 2 is stabilized at the predetermined pressure and temperature (stabilization step).

The motor of the rotation mechanism 13 is controlled to rotate the wafer boat 11 through the rotary table 10. The wafer boat 11 is rotated along with the semiconductor wafers W supported thereon, thereby uniformly heating the semiconductor wafers W.

When the interior of the reaction tube 2 is stabilized at the predetermined pressure and temperature, the supply of nitrogen through the purge gas feed line 18 is stopped. Then, an oxidizing gas is supplied through the process gas feed line 17 into the reaction tube 2, thereby oxidizing the silicon surface of the wafers W to form a silicon oxide film (oxidation step). In this embodiment, the oxidizing gas is oxygen ($O_2$) supplied at a predetermined flow rate, such as 5 liters/min, as shown in FIG. 3, (d). For example, the oxidation step is performed for 5 to 20 minutes, as shown in FIG. 3, (f).

When the silicon oxide film formed on the surface of the semiconductor wafers W reaches a predetermined thickness, the supply of oxygen through the process gas feed line 17 is stopped. Then, the interior of the reaction tube 2 is exhausted, and nitrogen is supplied through the purge gas feed line 18 at a predetermined flow rate, so that the gas inside the reaction tube 2 is exhausted to the exhaust line 5 (purge step).

Then, nitrogen is supplied through the purge gas feed line 18 into the reaction tube 2 at a predetermined flow rate, and the interior of the reaction tube 2 is heated by the heater 16 to a predetermined nitridation temperature, such as 900° C., as shown in FIG. 3, (a). Further, gas inside the reaction tube 2 is exhausted to set the interior of the reaction tube 2 at a predetermined pressure, such as 8,000 Pa (60 Torr), as shown in FIG. 3, (b). The pressure reduction and heating operations are performed until the reaction tube 2 is stabilized at the predetermined pressure and temperature (stabilization step). Furthermore, as described above the motor of the rotation mechanism 13 is controlled to rotate the wafer boat 11 through the rotary table 10, thereby uniformly heating the semiconductor wafers W.

When the interior of the reaction tube 2 is stabilized at the predetermined pressure and temperature, the supply of nitrogen through the purge gas feed line 18 is stopped. Then, a nitriding gas is supplied through the process gas feed line 17 into the reaction tube 2, thereby nitriding the silicon oxide film on the surface of the wafers W to form a silicon oxynitride film (film nitridation step). In this embodiment, the nitriding gas is ammonia supplied at a predetermined flow rate, such as 2 liters/min, as shown in FIG. 3, (e). For example, the film nitridation step is performed for 1 to 15 minutes, as shown in FIG. 3, (f). The silicon oxynitride film thus formed by this step has a thickness of, e.g. 10 to 30 nm and a nitrogen concentration of 5 to 20%.

When the silicon oxynitride film having a predetermined thickness is formed on the surface of the semiconductor wafers W, the supply of ammonia through the process gas feed line 17 is stopped. Then, the interior of the reaction tube 2 is exhausted, and nitrogen is supplied through the purge gas feed line 18 at a predetermined flow rate, so that the gas inside the reaction tube 2 is exhausted to the exhaust line 5 (purge step).

Then, the temperature inside the reaction tube 2 is lowered to a predetermined temperature, such as 300° C. Further, nitrogen is supplied through the purge gas feed line 18 into the reaction tube 2 at a predetermined flow rate, so that the pressure inside the process tube 2 is returned to atmospheric pressure, as shown in FIG. 3, (b). Then, the lid 6 is moved down by the boat elevator 128, and the wafer boat 11 is thereby unloaded out of the reaction tube 2, along with the wafers W having the silicon oxynitride film formed thereon (unload step).

<Experiment 1>

An experiment was conducted of forming a silicon oxynitride film by the film formation method described above, and examining the nitrogen concentration in the film. Specifically, in relation to present examples PE1 to PE5 with the pre-process according to the embodiment described above and comparative examples CE1 and CE2 without the pre-process, a silicon oxynitride film was formed on silicon wafers by the film formation process described above. The nitrogen concentration in the silicon oxynitride film thus formed was measured by x-ray photoelectron spectroscopy (XPS measurement). Further, the condition of dummy wafers used in the film formation process was examined on the basis of the nitrogen content in a thermal oxide film of the dummy wafers measured by secondary ion mass spectrometry (SIMS measurement). The dummy wafers were silicon wafers with a thermal oxide film of 100 nm thickness.

Figures 4, 5:
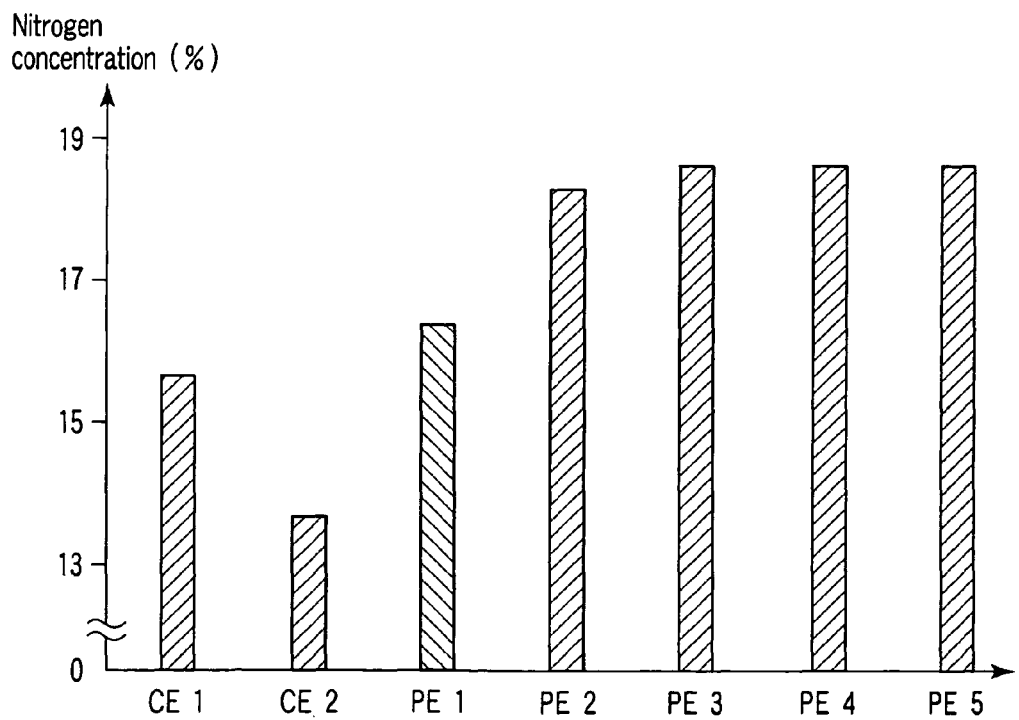
FIG. 4 is a diagram showing the data of present examples and comparative examples used in an experiment 1.
FIG. 5 is a graph showing the nitrogen concentration in a silicon oxynitride film according to the present examples and comparative examples mentioned in FIG. 4.

FIG. 4 is a diagram showing the data of the present examples PE1 to PE5 and comparative examples CE1 and CE2 used in the experiment 1. FIG. 5 is a graph showing the nitrogen concentration in the silicon oxynitride film according to the present examples PE1 to PE5 and comparative examples CE1 and CE2 mentioned in FIG. 4.

In the present examples PE1 to PE5, the pre-process described above was performed using ammonia as a nitriding gas prior to the film formation process. The nitridation time was set at 2, 4, 6, 8, and 6 hours in the present examples PE1 to PE5, respectively. In the present examples PE1 to PE4, new dummy wafers (with a thermal oxide film of 100 nm thickness) were placed on the wafer boat 11, i.e. the dummy wafers were replaced with new ones, before the pre-process. In the present example PE5, the dummy wafers were not replaced with new ones before the pre-process (i.e. dummy wafers with a surface already nitrided by the pre-nitridation were used).

In the comparative examples CE1 and CE2, the pre-process described above was not performed prior to the film formation process. In the comparative example CE1, the dummy wafers were not replaced with new ones before the film formation process (i.e. dummy wafers with a surface already nitrided by the pre-nitridation were used). In the comparative example CE2, the dummy wafers were replaced with new ones.

In FIG. 5, as shown by comparison of the comparative example CE2 with the present examples PE1 to PE4, even where the dummy wafers were replaced with new ones, the nitrogen concentration in the silicon oxynitride film was improved by the pre-process (pre-nitridation step). Particularly, where the pre-nitridation step was performed for 4 hours or more, the nitrogen concentration in the silicon oxynitride film was sufficiently improved. It is thought that this was based on the fact that the pre-nitridation step performed for 4 hours caused surface nitridation of members inside the reaction tube 2 (such as the inner wall of the reaction tube 2, the dummy wafers, and the wafer boat 11) to be essentially saturated.

Further, where the pre-nitridation step was performed for 6 hours or more, the nitrogen concentration in the silicon oxynitride film was more improved. It is thought that this was based on the fact that the pre-nitridation step performed for 6 hours or more caused surface nitridation of members inside the reaction tube 2 (such as the inner wall of the reaction tube 2, the dummy wafers, and the wafer boat 11) to be completely saturated. As shown in FIG. 4, dummy wafers were nitrided to saturation in the present examples PE3 and PE4.

Further, as shown by comparison of the comparative example CE1 with the present examples PE1 to PE5, the nitrogen concentration in the silicon oxynitride film was improved by the film formation method according to the embodiment, as compared with the conventional film formation method without the pre-process described above. Furthermore, as shown by the present example PE3 and present example PE5, the nitrogen concentration in the silicon oxynitride film took on almost the same value, i.e. it was essentially unchanged, without reference to the dummy wafers being replaced or not. This was opposite to the relationship between the comparative example CE1 and the comparative example CE2, in which the nitrogen concentration in the silicon oxynitride film was reduced by replacement of the dummy wafers. It is thought that this was based on the fact that the pre-nitridation step caused surface nitridation of members inside the reaction tube 2 (such as the inner wall of the reaction tube 2, the dummy wafers, and the wafer boat 11) to be saturated.

As described above, the film formation method according to the embodiment makes it possible to suppress change in the nitrogen concentration in silicon oxynitride films. Further, the method makes it possible to continuously and stably fabricate silicon oxynitride films having a predetermined nitrogen concentration.

<Experiment 2>

Next, an experiment was conducted of forming a silicon oxynitride film by the film formation method described above, and examining the nitrogen concentration in the reaction tube 2 (quartz). Specifically, in relation to present examples PE6 to PE8 with the pre-process according to the embodiment described above and a comparative example CE3 without the pre-process, a silicon oxynitride film was formed on silicon wafers by the film formation process described above. Then, the nitrogen concentration in the reaction tube 2 used in the process was measured by x-ray photoelectron spectroscopy (XPS measurement). Further, the condition of the reaction tube 2 was examined on the basis of the nitrogen content in the quartz composing the reaction tube 2 measured by secondary ion mass spectrometry (SIMS measurement). The dummy wafers were wafers with a surface nitrided to saturation in advance.

Figures 6, 7:
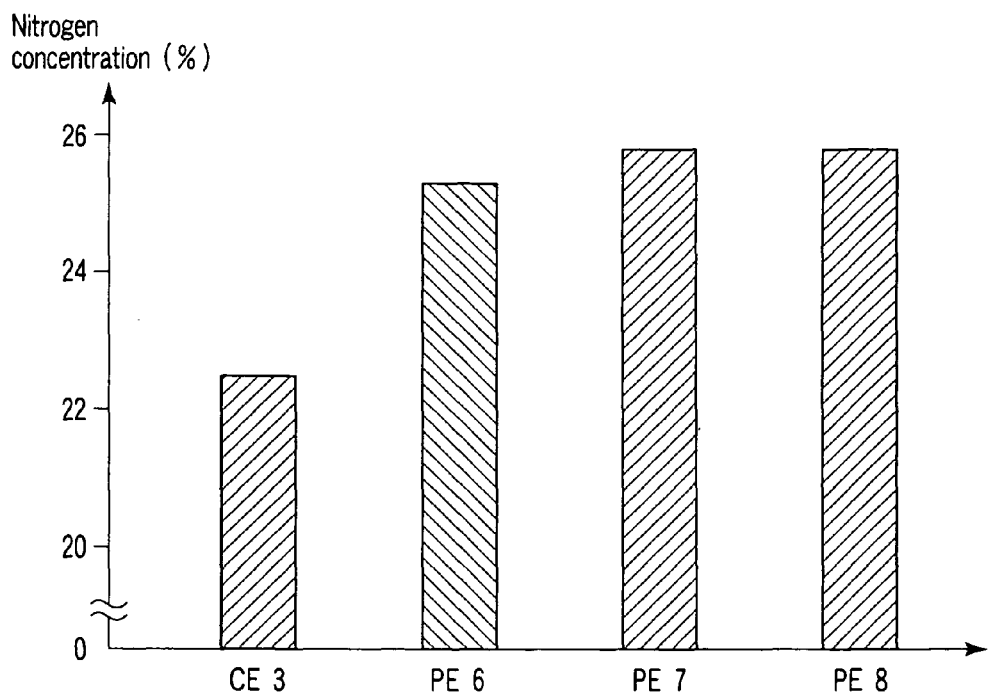
FIG. 6 is a diagram showing the data of present examples and a comparative example used in an experiment 2.
FIG. 7 is a graph showing the nitrogen concentration in a reaction tube according to the present examples and comparative example mentioned in FIG. 6.

FIG. 6 is a diagram showing the data of the present examples PE6 to PE8 and comparative example CE3 used in the experiment 2. FIG. 7 is a graph showing the nitrogen concentration in the reaction tube according to the present examples PE6 to PE8 and comparative example CE3 mentioned in FIG. 6.

In the present examples PE6 to PE8, the reaction tube 2 was replaced with a new one, and the pre-process described above was performed using ammonia as a nitriding gas prior to the film formation process. The nitridation time was set at 2, 4, and 6 hours in the present examples PE6 to PE8, respectively. In the comparative example CE3, the reaction tube 2 was replaced with a new one, and the pre-process described above was not performed prior to the film formation process.

As shown in FIGS. 6 and 7, where the pre-nitridation step was performed for 2 hours, the quartz composing the reaction tube 2 was essentially nitrided. Particularly, where the pre-nitridation step was performed for 4 hours or more, the quartz composing the reaction tube 2 was nitrided to saturation. Accordingly, where the reaction tube 2 is replaced with a new one, the pre-nitridation step is preferably performed for 2 hours or more, and more preferably for 4 hours or more.

As described above, according to this embodiment, the pre-process is arranged to nitride members inside the reaction tube 2 (such as the inner wall of the reaction tube 2, the dummy wafers, and the wafer boat 11) essentially to saturation. This arrangement makes it possible to suppress decrease in the nitrogen concentration in silicon oxynitride films to be formed. Further, this arrangement makes it possible to suppress change in the nitrogen concentration in silicon oxynitride films. Furthermore, this arrangement makes it possible to continuously and stably fabricate silicon oxynitride films having a predetermined nitrogen concentration.

In the embodiment described above, the pre-nitridation step is performed every time the film formation step of a silicon oxynitride film is performed. However, as long as no problems are caused by a change in the nitrogen concentration in a silicon oxynitride film, the pre-nitridation step may be performed after several repetitions of the film formation step.

In the embodiment described above, ammonia is used as the pre-process gas and the nitriding gas for nitriding an oxide film. However, the pre-process gas may be another nitriding gas or oxynitriding gas, such as nitrogen oxide, dinitrogen oxide, and nitrogen dioxide.

In the embodiment described above, the pre-process gas is supplied into the reaction tube 2 while it is not turned into plasma (i.e. in a non-plasma state), and the pre-process gas is activated by heating within the reaction tube 2. This activated pre-process gas acts on nitride members inside the reaction tube 2 (such as the inner wall of the reaction tube 2, the dummy wafers, and the wafer boat 11). Alternatively, the pre-process gas may be supplied into the reaction tube 2 while it is turned into plasma (i.e. in a plasma state), so that this activated pre-process gas acts on nitride members inside the reaction tube 2.

Figure 8:
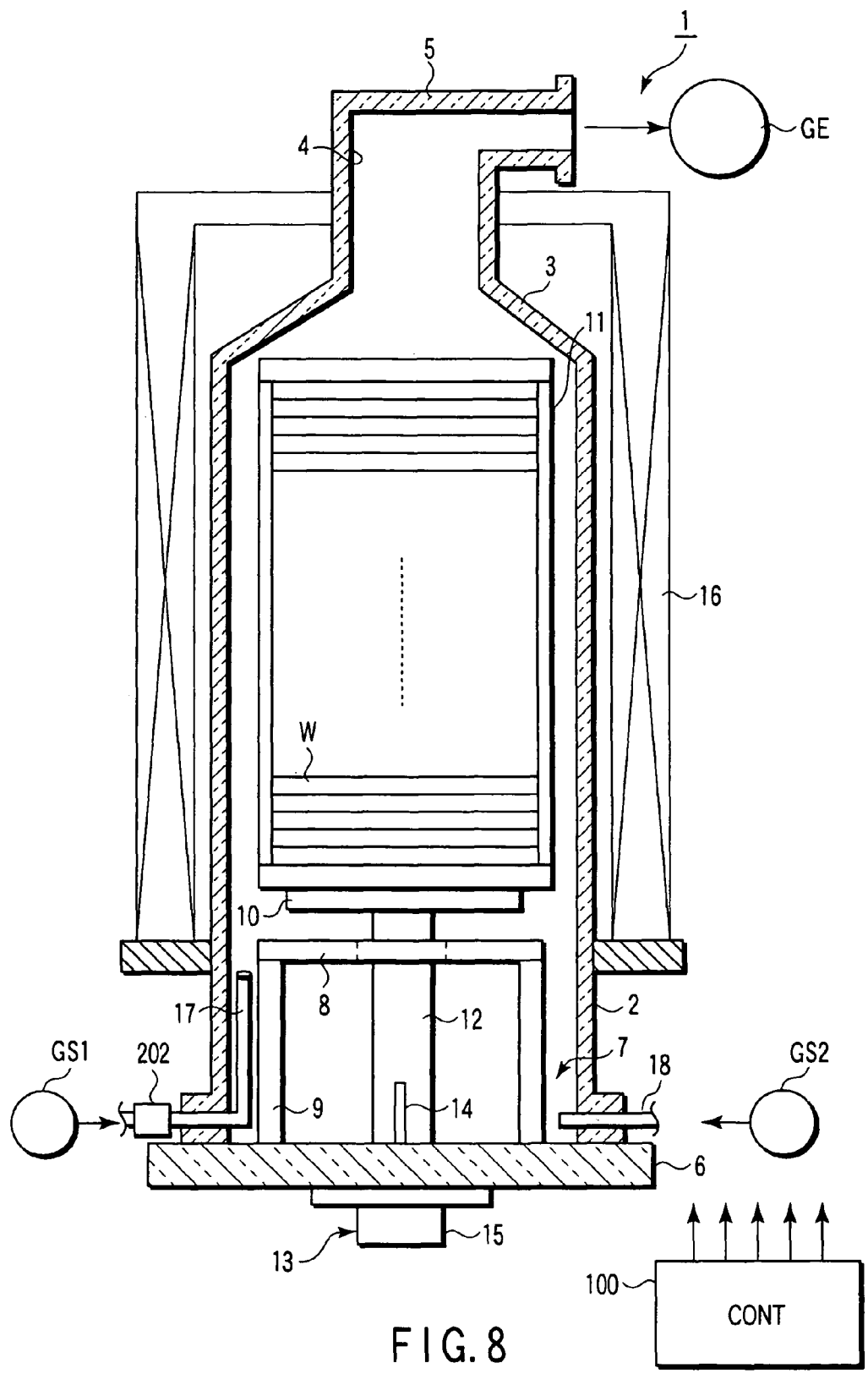
FIG. 8 is a view showing a vertical heat processing apparatus according to a second embodiment of the present invention.

FIG. 8 is a view showing a vertical heat processing apparatus according to a second embodiment of the present invention. This apparatus 201 has the same structure as the heat processing apparatus 1 described above, except that a plasma generator 202 is disposed on a process gas feed line 17. According to this film formation apparatus 201, when a pre-process gas supplied from a process gas supply source GS1 passes through the plasma generator 202, the pre-process gas is turned into plasma and activated (thereby generating nitrogen radicals). The pre-process gas thus activated is supplied into the reaction tube 2, and nitrogen radicals in the gas act on nitride members inside the reaction tube 2 (such as the inner wall of the reaction tube 2, the dummy wafers, and the wafer boat 11). In this case, the temperature inside the reaction tube 2 is preferably set to be a value within a range of 200 to 800° C. Further, the pressure of ammonia (ammonia partial pressure) inside the reaction tube 2 is preferably set to be a value within a range of 13.3 to 16,000 Pa (0.1 to 120 Torr). Using a pressure within this range, it is possible to efficiently perform the nitridation process.

The plasma generator 202 may be selected from various plasma generators, such as the parallel-plate type, magnetron type, inductive coupling type, and ECR (Electron Cyclotron Resonance) type. Where the plasma generator 202 utilizes an RF (radio frequency) power supply, it is preferable to use RF power of, e.g. 13.56 MHz at a power level of 50 to 2,000 W.

Where the film formation apparatus 201 is adopted, the steps of forming a silicon oxynitride film (the oxidation step and film nitridation step) may be performed while utilizing plasma. In this case, the temperature inside the reaction tube 2 may be set lower than the former case in the oxidation step and film nitridation step.

In the embodiments described above, the reaction tube 2 and so forth are made of quartz, but they may be made of, e.g. silicon carbide (SiC). Also in this case, the pre-process makes it possible to suppress change in the nitrogen concentration in silicon oxynitride films. Further, the pre-process makes it possible to continuously and stably fabricating silicon oxynitride films having a predetermined nitrogen concentration.

In the embodiments described above, the pre-nitridation step (nitridation time) is performed for 240 minutes (4 hours). However, the time period of the pre-nitridation step is preferably set at different values, depending on the temperature inside the reaction tube 2, the condition of quartz composing the reaction tube 2, the type of dummy wafers, the type of the pre-process gas, and so forth. Accordingly, the time period of the pre-nitridation step may be set to be less than 4 hours.

In the embodiments described above, the process gas feed lines 17 are disposed in accordance with the type of process steps. Alternatively, for example, a plurality of process gas feed lines 17 may be disposed in accordance with the type of gases. Further, a plurality of process gas feed lines 17 may be connected to the sidewall of the reaction tube 2 near the bottom, to supply each gas through a plurality of lines. In this case, a process gas is supplied through the plurality of process gas feed lines 17 into the reaction tube 2, and thereby more uniformly spreads in the reaction tube 2.

In the embodiments described above, the heat-processing apparatus employed is a heat-processing apparatus of the batch type having a single-tube structure. However, for example, the present invention is may be applied to a vertical heat-processing apparatus of the batch type having a reaction tube 2 of the double-tube type, which is formed of inner and outer tubes. Alternatively, the present invention may be applied to a heat-processing apparatus of the single-substrate type. The target substrate is not limited to a semiconductor wafer W, and it may be a glass substrate for, e.g., an LCD.

The control section 100 of the heat-processing apparatus is not limited to a specific system, and it may be realized by an ordinary computer system. For example, a program for executing the process described above may be installed into a multi-purpose computer, using a recording medium (a flexible disk, CD-ROM, or the like) with the program stored therein, so as to prepare the control section 100 for executing the process described above.

Means for supplying a program of this kind are diverse. For example, a program may be supplied by a communication line, communication network, or communication system, in place of a predetermined recording medium, as described above. In this case, for example, a program may be pasted on a bulletin board (BBS) on a communication network, and then supplied through a network while being superimposed on a carrier wave. The program thus provided would then be activated and ran under the control of the OS of the computer, as in the other application programs, thereby executing the process.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A film formation method for a semiconductor process for forming a silicon oxynitride film on a plurality of target substrates held at intervals in a vertical direction inside a reaction chamber of a vertical film formation apparatus, the reaction chamber being defined by an inner wall surface consisting mainly of a material selected from the group consisting of quartz and silicon carbide, the method comprising:

performing a pre-process of nitriding the inner wall surface of the reaction chamber by a pre-process gas until nitridation of the inner wall surface is saturated, while supplying ammonia gas as the pre-process gas into the reaction chamber without the target substrates loaded therein, and setting an interior of the reaction chamber at a first temperature and a first pressure, wherein the pre-process is arranged to supply the pre-process gas into the reaction chamber while not turning the pre-process gas into plasma, and the first temperature is set to be within a range of 800 to 1,050° C., and the first pressure is set to be within a range of 665 Pa to 100 kPa; and then, loading the target substrates into the reaction chamber, and performing a film formation process to form a silicon oxynitride film on the target substrates.

2. The method according to claim 1, wherein the film formation process comprises:

forming a silicon oxide film on the target substrates inside the reaction chamber; and then, nitriding the silicon oxide film on the target substrates by supplying a nitriding gas into the reaction chamber.

3. The method according to claim 2, wherein the target substrates comprise a silicon surface, and said forming a silicon oxide film comprises oxidizing the silicon surface supplying an oxidizing gas into the reaction chamber.

4. The method according to claim 2, wherein the pre-process gas is essentially the same gas as the nitriding gas for the film formation process.

5. The method according to claim 1, wherein the target substrates is loaded and unloaded along with a support member, which consists mainly of a material selected from the group consisting of quartz and silicon carbide, into and from the reaction chamber, and the pre-process is performed while the support member without the target substrates supported thereon is placed inside the reaction chamber.

6. A film formation method for a semiconductor process for forming a silicon oxynitride film on a plurality of target substrates held at intervals in a vertical direction inside a reaction chamber of a vertical film formation apparatus, the reaction chamber being defined by an inner wall surface consisting mainly of a material selected from the group consisting of quartz and silicon carbide, the method comprising:

performing a pre-process of nitriding the inner wall surface of the reaction chamber by a pre-process gas until nitridation of the inner wall surface is saturated, while supplying ammonia gas as the pre-process gas into the reaction chamber without the target substrates loaded therein, and setting an interior of the reaction chamber at a first temperature and a first pressure, wherein the pre-process is arranged to supply the pre-process gas into the reaction chamber while not turning the pre-process gas into plasma, and the first temperature is set to be within a range of 800 to 1,050° C., and the first pressure is set to be within a range of 665 Pa to 100 kPa; and then, loading the target substrates into the reaction chamber, and performing a film formation process to form a silicon oxynitride film on the target substrates, the film formation process comprising forming a silicon oxide film on the target substrates inside the reaction chamber, and then nitriding the silicon oxide film on the target substrates by supplying ammonia gas as a nitriding gas into the reaction chamber, wherein the target substrates comprise a silicon surface, and said forming the silicon oxide film comprises oxidizing the silicon surface by supplying an oxidizing gas into the reaction chamber.

7. The method according to claim 6, wherein the target substrates is loaded and unloaded along with a support member, which consists mainly of a material selected from the group consisting of quartz and silicon carbide, into and from the reaction chamber, and the pre-process is performed while the support member without the target substrates supported thereon is placed inside the reaction chamber.

* * * * *